United States Patent [19]
Kiwaki

[11] 4,377,758
[45] Mar. 22, 1983

[54] MAGNETIC AMPLIFYING APPARATUS
[75] Inventor: Hisakatsu Kiwaki, Katsuta, Japan
[73] Assignee: Hitachi, Ltd., Tokyo, Japan
[21] Appl. No.: 160,202
[22] Filed: Jun. 17, 1980
[30] Foreign Application Priority Data
Jun. 22, 1979 [JP] Japan .................................. 54-78167
[51] Int. Cl.³ .............................................. H03F 9/00
[52] U.S. Cl. .................................. 307/417; 307/418; 330/8
[58] Field of Search .............. 307/416, 417, 418, 262, 307/282, 275, 314; 330/8
[56] References Cited
U.S. PATENT DOCUMENTS

| 2,906,893 | 9/1959 | Mattson | 307/282 |
| 2,946,896 | 7/1960 | Alizon et al. | 307/417 |
| 2,980,846 | 7/1961 | Ringelman | 307/416 |
| 4,100,435 | 7/1978 | Komuro | 307/262 |

Primary Examiner—James W. Moffitt
Attorney, Agent, or Firm—Antonelli, Terry & Wands

[57] ABSTRACT

In an apparatus having a saturable magnetic core, a control winding wound on the magnetic core and supplied with a D.C. voltage in accordance with a desired phase angle, and an output winding wound on the magnetic core and supplied with an A.C. voltage through a load resistor, whereby the firing phase of a thyristor is controlled by a voltage across the load resistor, an additional winding is wound on the saturable magnetic core to detect the saturation of the saturable magnetic core by a rapid drop of a voltage across the additional winding. When the saturation is detected, the magnitude of the A.C. voltage applied to the output winding is increased. The phase angle characteristic of the magnetic phase shifter is determined under a low voltage condition prior to the saturation of the magnetic core, and after the saturation a high voltage is applied to the load resistor.

17 Claims, 21 Drawing Figures

F I G. 1
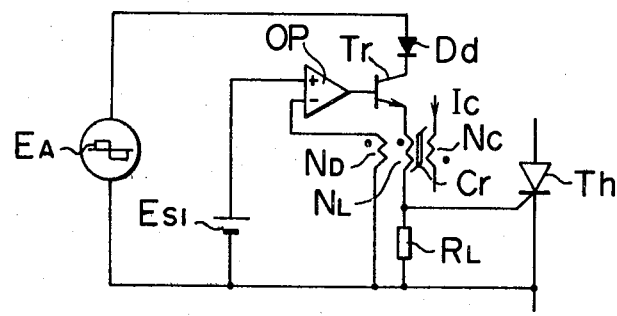
F I G. 2
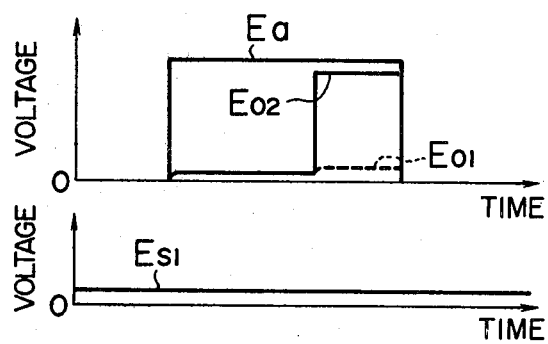

MAGNETIC AMPLIFYING APPARATUS

BACKGROUND OF THE INVENTION

1. Field of the Invention

The present invention relates to an improvement in a magnetic amplifying apparatus, and more particularly to a magnetic amplifying apparatus suitable for use as a gate controlling phase shifter for a thyristor or the like.

As is disclosed in the U.S. Pat. No. 4,100,435, for example, a magnetic phase shifter which utilizes an output firing angle of a magnetic amplifier has a convenient function which compares many signals under isolated conditions, amplifies the comparison result, and, after an appropriate time delay, produces an output suited to a gate signal for a semiconductor switching device such as a thyristor or a transistor. In addition, it has a simple and strong structure and is insensitive to noises, which are features inherent in the magnetic amplifier. Accordingly, it has a good reputation as a highly reliable control element.

2. Description of the Prior Art

A magnetic amplifier and a magnetic phase shifter are different from each other only in the way in which an output is utilized and their basic constructions are identical. In the following description, accordingly, the magnetic phase shifter having an expanded application is explained although it may be used as a magnetic amplifier as it is.

The basic construction of the magnetic amplifier or the magnetic phase shifter will now be explained with respect to a half-wave magnetic phase shifter. First, it includes a saturable magnetic core on which an A.C. winding (sometimes referred to as an output winding) and a control winding are wound. A half-wave rectified voltage is applied to the A.C. winding. Applied to the control winding is a D.C. voltage corresponding to a desired phase angle with a polarity opposite to an electromotive force by the A.C. winding.

Basically, with those elements as mentioned above it is possible to take out a phase angle signal indicative of the D.C. voltage applied to the control winding, across the A.C. winding or across a load resistor connected in series with the A.C. winding. During one-half cycle period in which no voltage is applied to the A.C. winding (referred to as a reset period), the magnetic core is magnetized in one polarity by an amount proportional to the magnitude of the D.C. voltage applied to the control winding. During the next one-half cycle period (control period), the magnetic core is magnetized in the opposite polarity by the voltage applied to the A.C. winding. The time period required for the magnetic core to reach saturation is proportional to the reset amount in the previous reset period. Accordingly, the A.C. winding voltage disappears at a phase angle which is proportional to the D.C. control voltage applied to the control winding. This A.C. winding voltage or the voltage across the load resistor connected in series with the A.C. winding is used as the phase angle signal.

As an example, a thyristor connected in an A.C. network which is in synchronism with the half-wave rectified voltage applied to the A.C. winding may be fired directly with the voltage across the load resistor described above. This constitutes a half-wave control rectifying circuit. By combining a plurality of such circuits, any type of thyristor power converter may be phase-controlled.

This type of magnetic phase shifter has a multiple of functions and advantages, such as simplicity and strongness in construction, insensitivity to noises, capability of isolation among multi-signals and capability of comparison, capability of amplification and capability of time delay, etc.

On the other hand, the magnetic phase shifter has disadvantages that it is large in size and expensive in cost. Accordingly, there is recently a tendency to replace the magnetic phase shifter by semiconductor devices.

SUMMARY OF THE INVENTION

It is an object of the present invention to provide a small size and inexpensive magnetic amplifying apparatus.

It is a primary feature of the present invention to provide means for suppressing the amount of electricity supplied from a power supply to the series connection of the output winding and the load when the magnetic core of the magnetic amplifier is not saturated, to an amount smaller than the amount when the magnetic core is saturated.

The characteristic of the magnetic amplifier is determined before the magnetic core is saturated from the non-saturated state, and once it has been saturated the characteristic thereof is not influenced by any high voltage or high current in the output winding. Accordingly, by sensing the saturation and the non-saturation of the magnetic core so that the magnetic amplifier or the magnetic phase shifter is operated in a small power mode in the non-saturation status in which the output characteristic of the magnetic amplifier or the magnetic phase shifter is controlled and once the magnetic core is saturated the amount of electricity supplied to the output winding and the load is increased, it is possible to produce a large output with a very small and inexpensive magnetic amplifying apparatus. The present invention is now explained in detail with reference to the embodiments illustrated in the accompanying drawings, in which:

BRIEF DESCRIPTION OF THE DRAWINGS

FIG. 1 shows an electric circuit diagram of one embodiment of a half-wave magnetic phase shifter in accordance with the present invention;

FIG. 2 shows voltage waveforms for illustrating the operation of the circuit shown in FIG. 1;

DETAILED DESCRIPTION OF THE PREFERRED EMBODIMENTS

Figure 3:
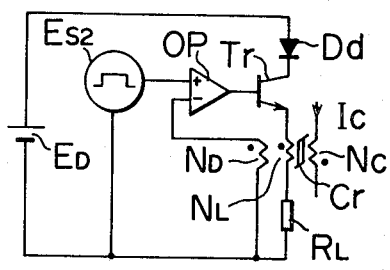
FIGS. 3 and 4 show electric circuit diagrams of different embodiments of the half-wave magnetic phase shifter in accordance with the present invention with modified power supply systems.

FIG. 1 shows an electric circuit diagram of an embodiment of a half-wave magnetic phase shifter in accordance with the present invention. However, a conventional technique in which a transistor $T_r$ is normally on is first explained.

A series circuit including an output winding $N_L$ wound on a magentic core Cr and a load $R_L$ is connected to an A.C. power supply $E_A$ through a backward current blocking diode Dd. A control winding $N_C$ is also wound on the magnetic core Cr and supplied with a control current Ic. Dots (.) placed in the figure adjacent to the windings $N_L$ and $N_C$ indicate the polarity of the windings, e.g. the beginning ends of the windings.

With the construction described above, a voltage Ea (volts) of the A.C. power supply $E_A$ is applied to the series circuit of the output winding $N_L$ and the load $R_L$ during each time period T/2 in which the A.C. power supply $E_A$ is of positive polarity. Assuming that the voltage drop across the diode Dd is small enough with respect to the power supply voltage Ea and the voltage drop across the load $R_L$ by an exciting current flowing through the output winding $N_L$ during each non-saturation period of the magnetic core Cr is also small enough with respect to the voltage Ea, a voltage approximately equal to the voltage Ea is applied to the output winding $N_L$ during the non-saturation period of the magnetic core Cr.

On the other hand, by changing the magnitude of the control current Ic, the reset amount of magnetic flux of the magnetic core Cr during the time period T/2 in which the A.C. power supply $E_A$ is of negative polarity and the diode Dd is in backward current blocking state, may be changed. Then, the magnetic core Cr saturates at a time point when the magnetic flux has changed by the amount equal to the reset amount during the positive polarity period of the A.C. power supply $E_A$. From this time point, the voltage Ea is applied to the load $R_L$. In other words, the magnetic phase shifter starts to produce an output as a magnetic phase shifter to provide a phase angle signal proportional to the magnitude of the control winding current Ic.

Accordingly, in order to assure the phase shift output to be completely zero, it is necessary that the magnetic core Cr does not saturate even when the voltage Ea is applied to the output winding $N_L$ during the time period T/2. To this end, the following relationship must be met:

$$Ea \times T/2 \times A \times 2B \times n_L \quad (1)$$

where A is the cross sectional area of the magnetic core, B is a magnetic flux density and $n_L$ is the number of turns of the output winding $N_L$. Now assuming that a thyristor Th in the order of 50 amperes is to be directly controlled in a 50 Hz commercial frequency magnetic phase shifter, T is equal to 20 milliseconds. Thus, Ea is equal to 10 volts. Assuming that 79 % nickel permalloy material is used as the magnetic core and A is equal to $50 \times 10^{31\ 6}$ m$^2$ and B is equal to 0.5 T, $n_L = 2000$ turns is derived from the formula (1). Even when a plurality of control windings Nc are provided, the total number of turns thereof is generally in the order of 1000 turns, and the weight of the number of turns of the output winding is large. Usually, a toroidal core is used in order to minimize the deterioration of the magnetic characteristic of the magnetic core. Thus, the work of winding 2000 to 3000 turns takes considerable time even with a special automatic winding machine. This is a big factor in the cost of the magnetic phase shifter. In addition, since the 2000 to 3000 turns must be wound through the aperture of the toroidal core, the aperture size must be increased accordingly. This results in an increase of the core size and also an increase of the weight and the cost. Furthermore, since the magnetic path length increases, the performance is degraded and an increased number of turns of the control winding is needed to compensate for it.

In order to resolve the above problem, it has been proposed to considerably decrease the number of turns of the output winding having the large weight, to 20 turns, for example. In this case, however, it is apparent from the above formula that the voltage Ea must be in the order of 0.1 volt. With such a low voltage, however, the voltage drop across the diode Dd (usually in the order of 0.6 volts), which has heretofore raised no problem, becomes significant, and the voltage Ea of the A.C. power supply $E_A$ must be in the order of 1 volt in order to apply the voltage of 0.1 volt to the output winding $N_L$ during the non-saturation period of the magnetic core Cr. In addition, since the voltage drop across the diode Dd changes due to variations in production and considerably varies depending on the temperature and the current, the voltage applied to the output winding $N_L$ changes significantly around 0.1 volt. Accordingly, the operation of the magnetic phase shifter will be very unstable.

In addition, since the output voltage to be applied to the load $R_L$ after the saturation of the magnetic core Cr also decreases to approximately 0.1 volt, it does not provide a sufficient power as a gate signal for the thyristor Th or a transistor, and an additional amplifier circuit must be provided. This complicates the circuit configuration accordingly.

The features added in the circuit in accordance with present invention are as follows: A detection winding $N_D$ is wound on the magnetic core Cr; a continuous control element, e.g. a transistor Tr is inserted in a feeding path extending from the power supply $E_A$ to the series connection of the output winding $N_L$ and the load transistor Tr receives a base input from an operational amplifier OP while a non-inverting input of the operational amplifier OP receives an output from a reference signal generating means $E_{S1}$ and an inverting input thereof receives an induced voltage at the detection winding $N_D$. Thus, with respect to the reference signal a feedback control system for feeding back the output winding voltage is provided.

With this construction, the operational amplifier OP has a substantially infinite amplification factor so long as its output does not saturate and it has a control function to control the voltage drop of the on-state transistor Tr such that the induced voltage of the detection winding $N_D$ is equal to the voltage of the reference signal generator $E_{S1}$, as is apparent from a known automatic control theory. Thus, if the number of turns of the detection winding $N_D$ is equal to the number of turns of the output winding $N_L$, e.g. 20 turns and the voltage of the reference signal generator $E_{S1}$ is equal to 0.1 volt, the induced voltage of the detection winding $N_D$ and hence the voltage applied to the output winding $N_L$ during the non-saturation of the magnetic core Cr will be 0.1 volt. In this case, if the voltage Ea of the A.C. power supply $E_A$ is 10 volts, the sum of the voltage drops across the diode Dd, the transistor Tr and the load resistor $R_L$ will be 9.9 volts. If the magnitude of the load resistor $R_L$ is sufficiently small, most of the voltage of 9.9 volts is shared by the diode Dd (0.6 volts) and the transistor Tr (9.3 volts) and hence the output is approximately zero.

As the magnetic core Cr saturates, the counter-electromotive force of the output winding $N_L$ becomes zero. If the operational amplifier OP holds the output appearing before the saturation of the magnetic core Cr, an output voltage $E_{O1}$ of 0.1 volt, for example, which corresponds to the voltage of the reference signal generator $E_{S1}$ as shown by a broken line in FIG. 2 would be applied to the load resistor $R_L$.

However, when the magnetic core Cr saturates, the induced voltage of the detection winding $N_D$ becomes zero, and if the amplification factor of the operational amplifier OP is sufficiently large the output of the operational amplifier OP saturates to the positive maximum by the voltage of the reference signal generator $E_{S1}$. As a result, the voltage drop across the transistor Tr becomes approximately zero. Since the counterelectromotive force of the output winding $N_L$ has disappeared by this time, most of the voltage of the A.C. power supply $E_A$ is applied to the diode Dd and the load resistor $R_L$. Thus, assuming that the voltage drop across the diode Dd is 0.6 volts, the voltage of 9.4 volts is applied to the load resistor $R_L$ as a phase shift output, as shown by a solid line in FIG. 2.

With the embodiment described above, the voltage applied to the output winding $N_L$ during the non-saturation of the magnetic core Cr can be readily maintained at a small voltage, and even if the voltage of the A.C. power supply $E_A$ or the voltage drops across the diode Dd and the transistor Tr vary, the voltage applied to the output winding $N_L$ is kept stable by the automatic control function of the operational amplifier OP. Accordingly, even if the number of turns of the output winding $N_L$ is reduced to 20 turns or to approximately 1/100 of the conventional winding, a stable operation of the magnetic phase shifter can be attained.

When the magnetic core Cr saturates, the small voltage control function described above conveniently disappears and a sufficient power level of voltage is applied to the load resistor $R_L$. Accordingly, like in the conventional magnetic phase shifter, a sufficient output for the gate signal to the thyristor Th or power transistor is produced and the rise of the output is steeper than the conventional one due to the amplification function of the operational amplifier OP and the transistor Tr.

Thus, in accordance with the first embodiment, the number of turns of the output winding $N_L$ can be considerably reduced in comparison with the prior art apparatus without resulting in unstable operation and a shortage of output power. The provision of the detection winding $N_D$ would be disadvantageous over the prior art apparatus, but the total number of turns of the output winding $N_L$ and the detection winding $N_D$ is 40 turns at most, as shown in the embodiment, which is much smaller than 2000 turns for the output winding of the prior art apparatus. Accordingly, the work of winding on the magnetic core Cr is considerably reduced and hence the cost is reduced. In addition, the weight is reduced by the reduction of the core size and hence the cost is reduced and the number of turns of the control winding is reduced because of the reduction in the magnetic path length. Accordingly, the cost is further reduced.

The provision of the operational amplifier OP may be considered disadvantageous, but it is much cheaper than the provision of the 2000 turn winding because the semiconductor integrated circuit technology has been rapidly developed. Accordingly, the advantages of the embodiment of the present invention are not lost.

While many advantages of the first embodiment of the present invention shown in FIG. 1 have been described, the basic advantage resides in that the smaller voltage Ea defined in the formula (1) may be used to produce the same magnitude of output as the prior art apparatus does and hence the core cross sectional area A, the number of turns $n_L$ of the output winding and the magnetic flux density B in the right term of the formula (1) can be reduced accordingly within the limit of satisfying the requirement of the formula (1). Particularly, the apparatus of FIG. 1 can reduce the size, weight and cost to 30% or less, respectively, of those of the prior art apparatus.

FIG. 3 shows another embodiment of the present invention. It differs from the embodiment shown in FIG. 1 in that an A.C. reference signal generator $E_{S2}$ takes place of the reference signal generator $E_{S1}$ of FIG. 1 and a D.C. power supply $E_D$ takes place of the A.C. power supply $E_A$ of FIG. 1.

With this construction, like in the embodiment of FIG. 1, the voltage applied to the output winding $N_L$ during the non-saturation of the magnetic core Cr is controlled to an output square wave voltage, e.g. 0.1 volt, of the reference signal generator $E_{S2}$, and after the magnetic core Cr saturates, most parts of the D.C. power supply $E_D$ are applied to the load resistor $R_L$. Accordingly, it is apparent that the same advantages as those of the embodiment of FIG. 1 are attained.

Furthermore, the apparatus of FIG. 3 is smaller in size and lighter in weight than the apparatus of FIG. 1. The square wave A.C. power supply $E_A$ in FIG. 1 and the reference signal generator $E_{S2}$ in FIG. 3 are usually constructed by magnetic multivibrators. The magnetic multivibrator of FIG. 3 needs a capacity which is approximately 1/100 as small as that of FIG. 1.

Figure 4:
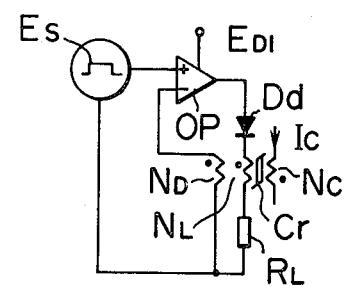

When the operational amplifier OP does not afford a sufficient output power by itself, the transistor Tr and the D.C. power supply Ed therefor may be eliminated as shown in FIG. 4 and the output of the operational amplifier OP may be applied directly to the series circuit of the output winding $N_L$ and the load resistor $R_L$ through the diode Dd. This makes the construction simpler because the power supply $E_{D1}$ for the operational amplifier OP is used as a common power supply.

Figure 5:
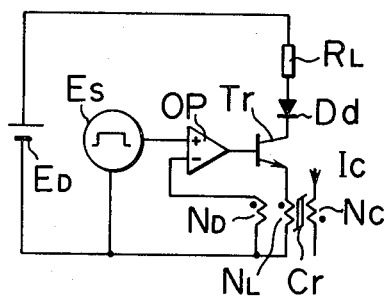
FIG. 5 shows a circuit diagram of another embodiment of the present invention, which is a modification of FIG. 3 in which the position of a load resistor is modified.

FIG. 5 shows another embodiment of the present invention. The symbols used have the same identification as those in FIG. 3. It differs from the embodiment of FIG. 3 in that the load resistor $R_L$ is connected to the collector of the transistor Tr instead of to the emitter. This construction has an advantage in that the saturation output of the operational amplifier OP may be small. In the embodiment of FIG. 3, after the magnetic core Cr saturates, the transistor Tr is in substantially the fully on-state and a voltage close to the D.C. power supply voltage $E_D$ is applied to the load resistor $R_L$. As a result, a voltage higher than the voltage across the load resistor $R_L$ must be applied to the base of the transistor Tr and the saturation output of the operational amplifier OP must be higher than the D.C. power supply voltage $E_D$, e.g. 10 volts. This means that the power supply for the operational amplifier (not shown; the D.C. power supply $E_D$ may be commonly used) must meet the same requirement. As a result, the apparatus is not economical. In the embodiment of FIG. 5, the operational amplifier OP need only produce, during the non-saturation of the magnetic core Cr, an output equal to the sum, e.g. 0.9 volts, of the base-emitter voltage drop of the transistor Tr (approximately 0.8 volts) and the counter-electromotive force of the output winding $N_L$ (approximately 0.1 volt). After the saturation of the magnetic core Cr, the counter-electromotive force of the output winding $N_L$ becomes substantially zero and the operational amplifier OP needs only to produce an output equal to the base-emitter voltage drop (approximately 0.8 volts) which is necessary to fully turn on the transistor Tr. In any case, the saturation output of 1 volt at most will be enough. Accordingly, the freedom of selection of the operational amplifier OP and the power supply therefor is enhanced and a more economical apparatus is provided.

Figure 6:
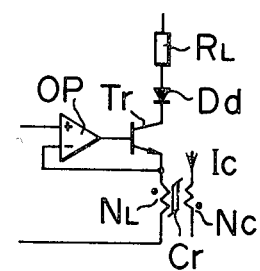
FIG. 6 shows a circuit diagram of another embodiment of the present invention, illustrating only a major portion with a modified feedback circuit.

By selecting the number of turns of the detection winding $N_D$ to be equal to that of the output winding $N_L$, the detection winding $N_D$ may be shared with the output winding $N_L$ as shown in FIG. 6. Thus, a simpler and more economical apparatus is provided.

Figure 7:
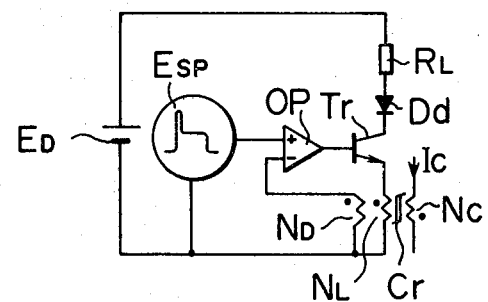
FIG. 7 shows an electric circuit diagram of another embodiment of the half-wave magnetic phase shifter in accordance with the present invention having an improved linearity in the phase characteristic.

FIG. 7 shows another embodiment of the present invention. The construction is similar to that of FIG. 5 except that the signal generator $E_{SP}$ produces a square wave with a pulse voltage superimposed on a rising edge thereof.

The magnetic core material for the magnetic phase shifter has preferably a small exciting current and a square magnetization curve. A 79%—nickel permalloy magnetic core has a small exciting current but has a poor squareness in the magnetization curve. When this material is used with a square wave excitation, it shows a poor linearity in the phase shift characteristic. It has been proposed to superimpose a pulse voltage on the rising edge of the square wave voltage to improve the linearity.

In this case, the magnitude of the pulse voltage must be several tens of times as high as the square wave voltage in order to effectively improve the linearity. In the prior art apparatus described above, when the D.C. power supply $E_D$ is of 10 volts, a pulse voltage of several hundreds of volts with a sufficient power to drive the output winding $N_L$ is necessary, and a separate means such as a pulse transformer is necessary to produce such a high pulse voltage. The output winding must have a high withstand voltage. This makes the magnetic phase shifter more expensive and larger in size. Furthermore, when the high pulse voltage appears in the output it may damage the gate of the load thyristor or the like.

Figure 8:
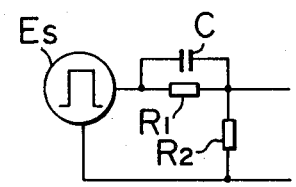
FIG. 8 shows a specific circuit diagram of a signal generator in the circuit shown in FIG. 7.

On the other hand, in the embodiment of FIG. 7, the output of the signal generator $E_{SP}$ is a square wave voltage of 0.1 volt as mentioned above and the pulse voltage of several volts at most is to be superimposed thereon. Since it is an input to the operational amplifier OP, only a little power is required. For example, as shown in FIG. 8, a square wave having a crest value of several volts and produced from an output of the conventional signal generator $E_S$ is divided by a voltage divider comprising resistors $R_1$ and $R_2$ (the magnitudes of which are chosen such that a dividing ratio $R_2/(R_1+R_2)$ is equal to one to several tens) and a differentiation capacitor is connected in parallel with the resistor $R_1$. In this manner, it can be readily converted to a square wave signal of approximately 0.1 volt with a pulse voltage of several volts superimposed at the rising edge thereof. Since the amplitude of the pulse voltage is of the same order as the voltage $E_D$ applied to the load resistor $R_L$ after the saturation of the magnetic core Cr, the withstand voltage of the output winding need not be increased and there is no risk of damage to the gate of the load thyristor.

Figure 9:
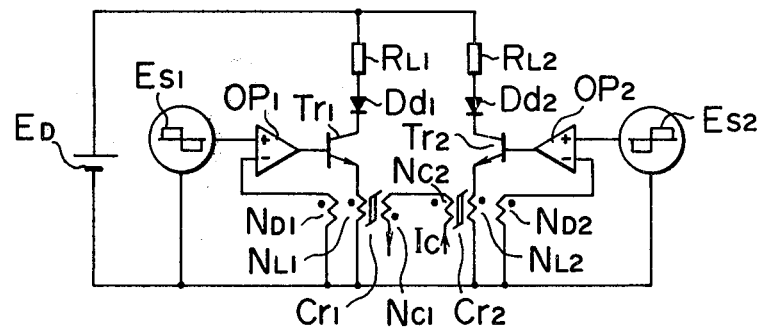
FIG. 9 shows an electric circuit diagram of an embodiment of a full-wave magnetic phase shifter in accordance with the present invention.

In the embodiments of the present invention described so far, the half-wave magnetic phase shifters have been specifically explained for easy understanding. The present invention is equally applicable to a full-wave magnetic phase shifter which is frequently used in actual applications. FIG. 9 shows an embodiment in which the embodiment of FIG. 5 is applied for the full-wave implementation. Except for sharing the D.C. power supply $E_D$, two identical sets of magnetic phase shifter units shown in FIG. 5 are used. The symbols in FIG. 9 have the same identifications as those in FIG. 5 except for the numbers representing the unit numbers being added to the respective symbols. The reference signal generator $E_{S2}$ produces an output which is different by 180 degrees in phase from the output of the reference signal generator $E_{S1}$.

With this construction, the transistors $Tr_1$ and $Tr_2$ repeat to be alternately turned on and off and the magnetic cores $Cr_1$ and $Cr_2$ are controlled equally by the control current Ic which commonly flows through the control windings $N_{C1}$ and $N_{C2}$. As a result, phase shift outputs having 180 degree phase difference are produced across the load resistors $R_{L1}$ and $R_{L2}$. The other advantages are the same as those of FIG. 5.

For a multi-phase magnetic phase shifter, it will be apparent that the same advantages as those of the full-wave magnetic phase shifter are attained by providing a necessary number of half-wave units each having different phase square wave signal and controlling those by a common control current.

Figure 10:
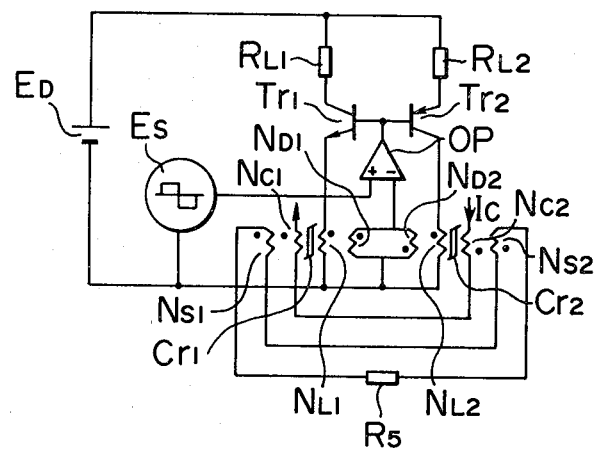
FIG. 10 shows an electric circuit diagram of another embodiment which is an improvement over the circuit shown in FIG. 9.

FIG. 10 shows another embodiment of the present invention, which is again directed to the full-wave magnetic phase shifter like the embodiment of FIG. 9. The symbols have the same identifications. The only differences from the embodiment of FIG. 9 are; (1) the transistor $Tr_2$ is complementary to the transistor $Tr_1$ (in the illustrated embodiment, the transistor $Tr_1$ is of NPN type and the transistor $Tr_2$ is of PNP type); (2) the reference signal generator $E_S$ is a square wave A.C. power supply which is common to the respective magnetic phase shifter units; (3) the magnetic cores $Cr_1$ and $Cr_2$ have shorting windings $N_{S1}$ and $N_{S2}$ wound thereon, which are shorted through a low resistance resistor $R_S$; (4) the detection windings $N_{D1}$ and $N_{D2}$ are also shorted and induced voltages thereof are compared in the common operational amplifier OP with the square wave A.C. voltage from the signal generator $E_S$ and the output of the operational amplifier OP is applied to both the transistors $Tr_1$ and $Tr_2$; and (5) no diode is connected in series with the transistors $Tr_1$ and $Tr_2$.

In the full-wave magnetic phase shifter, in order to provide a time delay in operation for stabilizing the control system, to balance two half-wave outputs of different phase and to eliminate the affect by the noise induced in the control input, the shorting windings $N_{S1}$ and $N_{S2}$ are usually shorted by the low resistance resistor $R_S$ as shown in the embodiment of FIG. 10. In this case, the effect of shorting is proportional to square of the number of turns of the shorting winding and inversely proportional to the resistance of the shorting resistor. Accordingly, if the numbers of turns of the detection windings $N_{D1}$ and $N_{D2}$ are sufficiently small with respect to the numbers of turns of the shorting windings $N_{S1}$ and $N_{S2}$ the overall shorting effect is not substantially affected even if the windings $N_{D1}$ and $N_{D2}$ are shorted in parallel as shown in FIG. 10. Due to this shorting effect, it is apparent that the voltages of the output windings $N_{L1}$ and $N_{L2}$ are always equal in their absolute values but opposite in their polarities, assuming that the dots [•] indicate the positive terminals. Accordingly, even during the off-state of the transistor $Tr_2$ and the reset state of the magnetic flux of the magnetic core $Cr_2$, the absolute value of the voltage induced in the output winding $N_{L2}$ is equal to the absolute value of the voltage applied to the output winding $N_{L1}$ through the transistor $Tr_1$ and it does not exceeds $E_D$. In the embodiment of FIG. 9 which has no shorting winding, the voltage induced in the output winding on the reset state magnetic core may exceed $E_D$ if the impedance of the control circuit is high. Accordingly, unless the diodes $Dd_1$ and $Dd_2$ are inserted, the current may flow back to the power supply $E_D$ through the transistors $Tr_1$ and $Tr_2$ to damage these transistors. In the embodiment of FIG. 10, there is no such risk and hence the diodes may be omitted.

Furthermore, since the detection winding $N_{D1}$ and $N_{D2}$ may be connected in parallel, the two transistors $Tr_1$ and $Tr_2$ can be controlled by the single operational amplifier OP. This is an economic feature.

Figure 11:
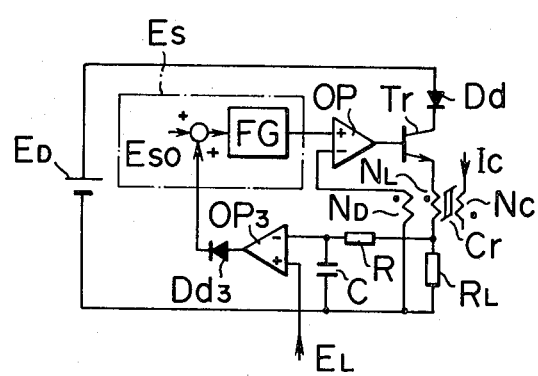
FIG. 11 shows an electric circuit diagram of a half-wave magnetic phase shifter in accordance with the present invention, in which a lower limit for a duty factor is provided.

FIG. 11 shows another embodiment of the present invention. For simplicity, it is shown in comparison with FIG. 3 although it is equally applicable to other embodiments. The elements in FIG. 11 which are like those in FIG. 3 have the same identifications. It differs from the embodiment of FIG. 3 in that (1) the voltage across the load resistor $R_L$ is applied to the inverting input terminal of the operational amplifier $OP_3$ through a smoothing circuit comprising a resistor R and a capacitor C, (2) an output limiting signal $E_L$ is applied to the non-inverting input terminal of the operational amplifier $OP_3$, (3) the output of the operational amplifier $OP_3$ is applied to the signal generator $E_S$ through the diode $Dd_3$, (4) it is combined with the reference voltage $E_{SO}$ in the signal generator $E_S$, and (5) a square wave having a crest value equal to the sum is generated through a square wave generator FG.

With this construction, the inverting input signal of the operational amplifier $OP_3$ is equal to the mean value of the output from the magnetic phase shifter produced across the load resistor $R_L$ and is proportional to the duty factor of the output. If it is higher than the output lower limit signal $E_L$, the output of the operational amplifier $OP_3$ is negative so that the output from the diode $Dd_3$ is zero and the crest value of the output of the signal generator $E_S$ is equal to $E_{SO}$. This is substantially equal to the operation of the embodiment of FIG. 3.

Figure 12:
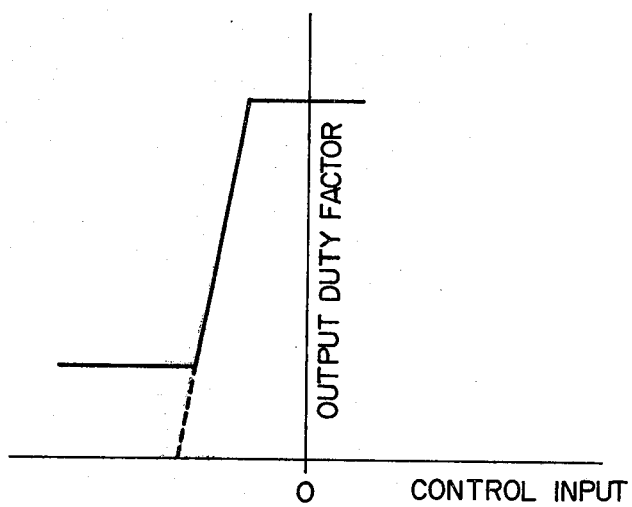
FIG. 12 shows a phase characteristic of the magnetic phase shifter of FIG. 11.

On the other hand, if the inverting input signal to the operational amplifier $OP_3$, that is, the output duty factor signal of the magnetic phase signal tends to be smaller than the output lower limit signal $E_L$, the output of the operational amplifier $OP_3$ becomes positive and it is combined with the reference voltage $E_{SO}$ through the diode $Dd_3$. As a result, the crest value of the output of the signal generator $E_S$ increases. Accordingly, the magnetic core Cr is more readily saturated and the reduction of the output of the magnetic phase shifter produced across the load resistor $R_L$, that is, the reduction of the output duty factor signal is prevented. After all, the output duty factor of the magnetic phase shifter does not decrease below a value corresponding to the output lower limit signal $E_L$. This is shown by a duty factor characteristic curve shown by the solid line in FIG. 12.

This characteristic is similar to an over-excitation state of the magnetic core Cr in which an excessive magnitude of D.C. power supply voltage $E_D$ is used in the prior art magnetic phase shifter.

This characteristic is very useful when the output duty factor is to be controlled to not less than a predetermined value for assuring a margin in a commutation angle to prevent commutation failure when the magnetic phase shifter is used to control the gate of the thyristor type D.C.-A.C. inverter.

Figure 13:
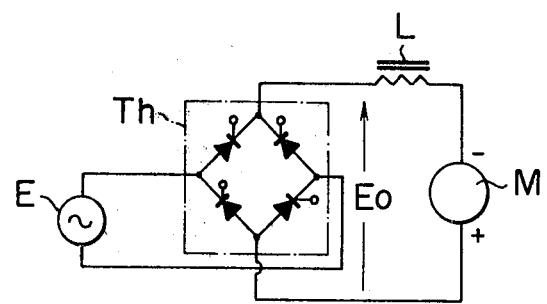
FIG. 13 shows a motor control circuit diagram with a thyristor converter.

In a single-phase thyristor type D.C.-A.C. inverter shown in FIG. 13, an output of a D.C. motor M is applied to D.C. terminals of a thyristor bridge Th through a smoothing reactor L. A.C. terminals of the thyristor bridge Th are connected to an A.C. power supply E.

Figure 14:
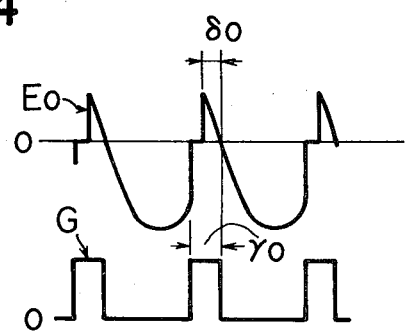
FIG. 14 shows voltage waveforms of the circuit of FIG. 13.

For the illustrated polarity of the output voltage of the D.C. motor M, the thyristor bridge Th produces an output voltage Eo as shown in FIG. 14. Since the thyristor bridge commutates during a positive voltage period corresponding to a margin angle $\delta_o$ for commutation, it is essential to keep the width $\gamma_o$ of a thyristor gate signal G not less than a predetermined width in order to prevent commutation failure.

When the magnetic phase shifter is used to control the gate of the thyristor, the conventional over-excitation method which uses an excessive magnitude of power supply voltage has a disadvantage in that the lower limit of the output duty factor significantly varies with the variation in the magnetic core characteristic and the variation in the power supply voltage.

On the other hand, in the embodiment of FIG. 11, the lower limit of the output duty factor is automatically controlled to the predetermined value and hence the disadvantage encountered in the prior art apparatus is overcome. Thus, a stable lower limit control is attained.

In a thyristor apparatus for controlling a main motor of an electric vehicle, it is frequently required, for the convenience of operation, to prevent the output duty factor from increasing beyond a predetermined value, that is, to control the upper limit. In such a case, the inverting input of the operational amplifier $OP_3$ in the embodiment of FIG. 11 is substituted for the non-inverting input, the output of the diode $Dd_3$ is subtracted from the reference voltage $E_{SO}$ and the output amplitude of the square wave generator FG is determined in accordance with the difference. In this manner, the upper limit control is readily attained in a similar way to the lower limit control described above.

Figure 15:
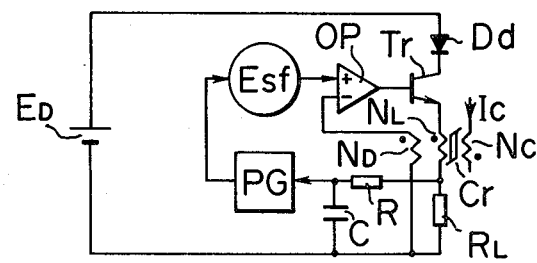
FIG. 15 shows an electric circuit diagram of one embodiment of a half-wave magnetic shifter in accordance with the present invention with a variable frequency feature.
Figure 16:
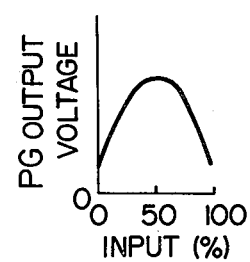
FIG. 16 shows a characteristic curve of a pattern generator in the circuit shown in FIG. 15.

FIG. 15 shows another embodiment of the present invention. The elements which are similar to those in FIG. 11 have the same identifications. It differs from the embodiment of FIG. 11 in that the duty factor signal from the output of the magnetic phase shifter taken out of the smoothing circuit comprising the resistor R and the capacitor C is applied to a pattern generator PG having an output characteristic as shown in FIG. 16, and the output of the pattern generator PG is applied to a variable frequency reference signal generator $E_{Sf}$, which produces a square wave signal having a frequency proportional to the output voltage of the pattern generator PG and a constant amplitude (i.e. reference amplitude).

With this construction, the output frequency is lowest at 0% or 100% duty factor of the magnetic phase shifter output and highest at 50%. When the output of the magnetic phase shifter in accordance with the present embodiment is used as the gate signal for a circuit in which the pulsation in the output is maximum at 50% duty factor for a given frequency like in a known thyristor chopper, the pulsation in the chopper output can be significantly reduced to compare with a constant frequency circuit because the frequency is highest at 50% duty factor, and the pulsation factor of the chopper output can be kept constant independently of the duty factor by properly setting the I/O characteristic of the pattern generator PG. As a result, the load of the chopper, e.g. a D.C. motor can be always operated within a permitted limit of pulsation factor and the increase in the size of reactor for smoothing a motor current is prevented.

Figure 17:
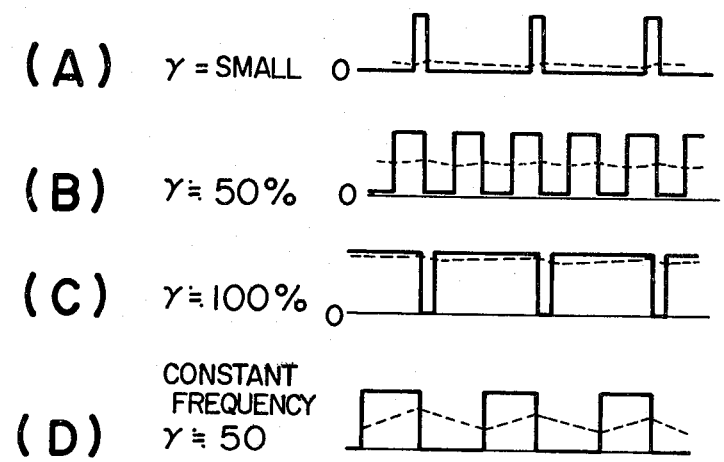
FIG. 17, including A–D, shows an output voltage waveform of a thyrister chopper which is controlled by the circuit shown in FIG. 15.

FIG. 17 shows the chopper output voltages obtained by the above chopper control. Solid lines show the chopper output voltages before they are smoothened and broken lines show the chopper output voltages after being smoothened. It is seen from FIG. 17 that the frequency is equal when the chopper duty factor $\gamma$ is small and when it is close to 100% and the pulsation factors of the smoothened output voltages are low and substantially equal for both cases.

On the other hand, when the chopper control is conducted with the duty factor of approximately 50% at the same frequency, the pulsation factor of the smoothened output voltage increases as shown in FIG. 17 (D). The pulsation factor can be reduced by increasing the chopper frequency, as shown in FIG. 17 (B).

In the above description, the output winding voltage is maintained at the reference level by the feedback system which negatively feeds back the output winding voltage of the magnetic phase shifter. With this system, a large output can be produced during the saturation of the magnetic core while suppressing the voltage applied to the output winding only during the non-saturation period of the magnetic core.

The present invention is not limited to the system described above but a basic concept of the present invention resides in the provision of means for suppressing the amount of electricity supplied from the power supply to the series connection of the output winding and the load during the non-saturation of the magnetic core, to the amount smaller than that in the saturation state of the magnetic core.

Figure 18:
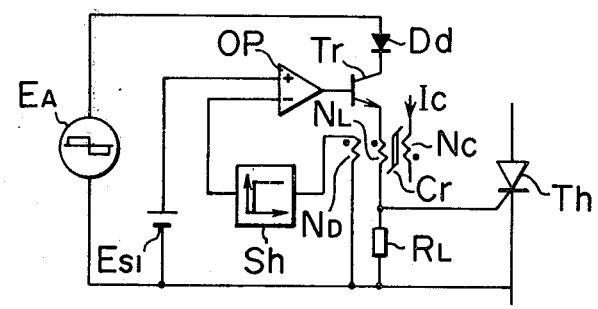
FIG. 18 shows an electric circuit diagram of an embodiment of a half-wave magnetic phase shifter in accordance with the present invention, which has no feedback control system.

FIG. 18 shows another embodiment of the present invention which is based on the above teaching. It is shown in comparison with FIG. 1. It differs from the embodiment of FIG. 1 in that a Schmitt circuit Sh is inserted between the detection winding $N_D$ and the operational amplifier OP. In the present embodiment, the saturation or non-saturation of the magnetic core is sensed to suppress the power supply voltage to a smaller magnitude in the non-saturation period than in the saturation period. It includes no negative feedback control system. During the non-saturation of the magnetic core Cr, a certain magnitude of voltage is produced in the output winding $N_L$ and hence in the detection winding $N_D$. This is sensed by the Schmitt circuit, which produces a constant voltage, which is subtracted from the voltage of the reference voltage source $E_{S1}$. By properly selecting the relationship between those factors, the amount of electricity supplied to the series connection of the output winding $N_L$ and the load resistor $R_L$ through the transistor Tr can be suppressed to a small amount. However, the precision thereof is much lower than that of the feedback control system. Accordingly, the present embodiment is not suited for use in suppressing the amount of electricity to a small amount which is comparable to a forward voltage drop of the diode Dd, but when a large output voltage is required for the load resistor $R_L$ the amount of electricity can be suppressed to a small amount to compare with the amount in the saturation period in which the large output voltage is required. In the saturation period, the voltage of the detection winding $N_D$ is minimum and the Schmitt circuit Sb does not produce the output. Thus, the operational amplifier OP produces the saturation output and the power supply voltage Ea is directly applied to the load resistor $R_L$.

What is claimed is:

1. A magnetic amplifying apparatus comprising a saturable magnetic core, a control winding wound on said magnetic core, an output winding wound on said magnetic core, power supply means for feeding a series connection including said output winding and a load to thereby produce an output from said output winding having a phase controlled in accordance with the impedance reduction of said output winding due to the saturation of said magnetic core, wherein means is further provided for suppressing the amount of electricity supplied from said power supply means to said series connection during the non-saturation period of said magnetic core to a smaller amount than during the saturation period of said magnetic core.

2. A magnetic amplifying apparatus according to claim 1, wherein said amount of electricity is a voltage.

3. A magnetic amplifying apparatus according to claim 1, wherein said suppression means includes a semiconductor device connected in a closed circuit including said power supply means and said series connection.

4. A magnetic amplifying apparatus comprising a magnetic core, a control winding wound on said magnetic core, an output winding wound on said magnetic core, a power supply for feeding a series connection including said output winding and a load, wherein means is further provided for suppressing the amount of electricity supplied from said power supply to said series connection during the non-saturation period of said magnetic core to a smaller amount than during the saturation period of said magnetic core, wherein said suppressing means includes means for generating a reference signal and a negative feedback control system for negatively feeding back said amount of electricity of said output winding to said reference signal to control said amount of electricity.

5. A magnetic amplifying apparatus according to claim 4, wherein said amount of electricity is a voltage.

6. A magnetic amplifying apparatus according to claim 4, wherein said suppressing means includes a semiconductor device connected in a closed circuit including said power supply means and said series connection.

7. A magnetic amplifying apparatus according to claim 6, wherein said semiconductor device is a transistor and said load is connected to a collector of said transistor.

8. A magnetic amplifying apparatus according to claim 4, wherein said power supply means is a D.C. power supply, and said reference signal generating means includes means for generating an A.C. signal.

9. A magnetic amplifying apparatus according to claim 8, wherein said A.C. signal generating means produces a larger signal near a rising edge of the output signal than in other period.

10. A magnetic amplifying apparatus according to claim 4, wherein said negative feedback control system includes an operational amplifier for comparing said amount of electricity of said output winding with said reference signal.

11. A magnetic amplifying apparatus according to claim 10, further comprising a continuously controlling element connected in a closed circuit including said output winding and said load and controlled by the output of said operational amplifier.

12. A magnetic amplifying apparatus according to claim 10, wherein said power supply means includes a power supply for said operational amplifier.

13. A magnetic amplifying apparatus comprising a pair of magnetic cores, a pair of control windings each wound on associated one of said magnetic cores and connected in series to each other, a pair of output windings each wound on associated one of said magnetic cores, a pair of loads each connected in series with associated one of said output windings, a power supply for respectively supplying A.C. half-wave voltages of opposite phase to a pair of series connections each including associated one of said output windings and associated one of said loads, wherein a pair of suppression means are further provided each for suppressing the voltages to be supplied from said power supply to the associated one of said series connections during non-saturation period of the associated one of said magnetic cores to a smaller amount than that in saturation period of said associated one magnetic core.

14. A magnetic amplifying apparatus according to claim 13, wherein said power supply includes a D.C. power supply, a pair of continuously controlling elements respectively connected in a pair of closed circuits each including said power supply and the associated one of said output windings, and an A.C. signal source for rendering said continuously controlling elements conductive alternately, and said pair of suppressing means include a common operational amplifier inserted in a signal transfer path extending from said A.C. signal source to said continuously controlling elements.

15. A magnetic amplifying apparatus comprising a saturable magnetic core, a control winding wound on said magnetic core, an output winding wound on said magnetic core, power supply means for feeding a series connection including said output winding and a load to thereby produce an output from said output winding having a phase controlled in accordance with the impedance reduction of said output winding due to the saturation of said magnetic core, wherein said apparatus further comprises means for suppressing the amount of electricity supplied from said power supply means to said series connection during the non-saturation period of said magnetic core to a suppression amount smaller than the amount during the saturation period of said magnetic core, and means for adjusting said suppression amount.

16. A magnetic amplifying apparatus comprising a magnetic core, a control winding wound on said magnetic core, an output winding wound on said magnetic core, a power supply for feeding a series connection including said output winding and a load, wherein said apparatus further comprises means for suppressing the amount of electricity supplied from said power supply to said series connection during the non-saturation period of said magnetic core to a suppression amount smaller than the amount during the saturation period of said magnetic core, and means for adjusting said suppression amount, wherein said adjusting means includes means for adjusting said suppression amount in response to the output of said magnetic amplifying apparatus.

17. A magnetic amplifying apparatus according to claim 16, wherein said adjusting means includes a function generating means responsive to the output of said magnetic amplifying apparatus and means for adjusting the suppression amount in response to the output of said function generating means.

* * * * *